(12) United States Patent
Lin et al.

(10) Patent No.: US 6,316,805 B1
(45) Date of Patent: Nov. 13, 2001

(54) ELECTROSTATIC DISCHARGE DEVICE WITH GATE-CONTROLLED FIELD OXIDE TRANSISTOR

(75) Inventors: Geeng-Lih Lin; Ming-Dou Ker, both of Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/478,327

(22) Filed: Jan. 6, 2000

(51) Int. Cl.[7] ............................. H01L 29/76; H01L 29/94
(52) U.S. Cl. ........................................... 257/328; 257/330
(58) Field of Search ...................................... 257/328, 330

(56) References Cited
U.S. PATENT DOCUMENTS 6,074,909 * 6/2000 Gruening .
6,180,975 * 1/2001 Radens et al. .
6,207,992 * 3/2001 Mori .
6,255,689 * 7/2001 Lee .

* cited by examiner

*Primary Examiner*—Stephen D. Meier
(74) *Attorney, Agent, or Firm*—Powell, Goldstein, Frazer & Murphy LLP

(57) ABSTRACT

An electrostatic discharge (ESD) device comprising a field implant region being in the substrate. A STI is on the field implant region and a gate oxide layer is on the STI. A S/D region is below the gate oxide layer and is on the two sides of the STI. A gate is on the gate oxide layer and a spacer is on the sidewall of the gate. Some alternatives can be devised as follows: (1) The length between STI region and LDD region is zero; (2) without LDD region; (3) with an N well region below the field implant region, the LDD region and S/D region; (4) with a deep N well region below the N well region. The ESD device in the present invention has a deeper current path to increase the heat dissipation through a larger device volume. Therefore, the device can sustain a much higher ESD robustness in a smaller silicon area.

8 Claims, 4 Drawing Sheets

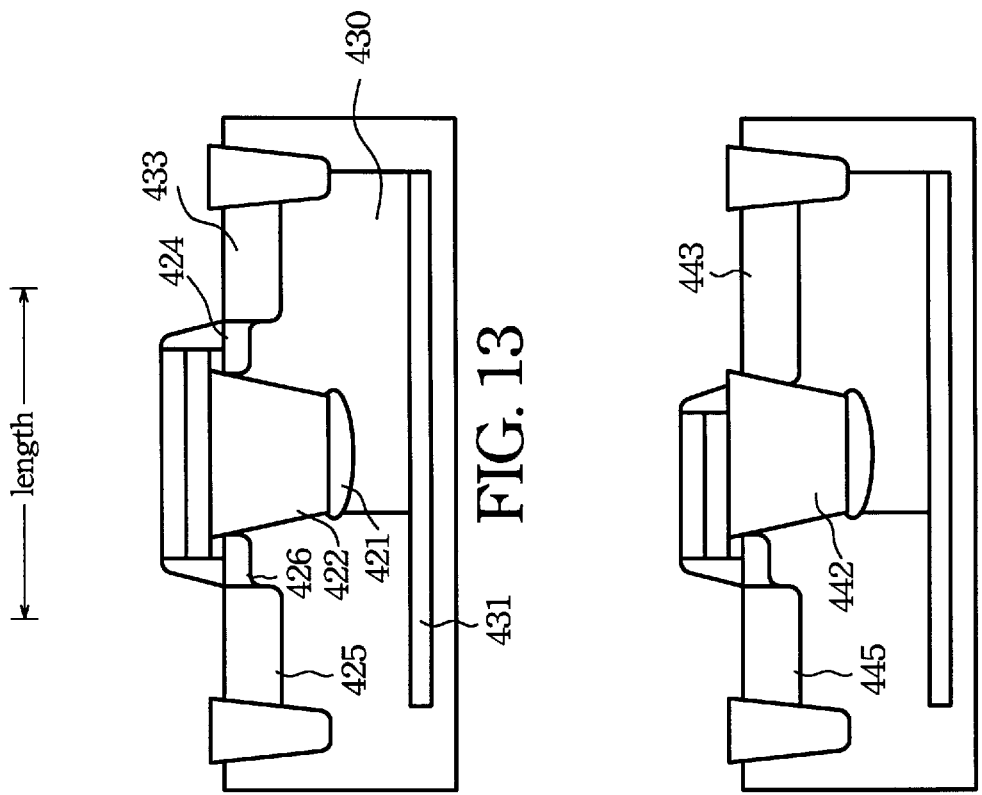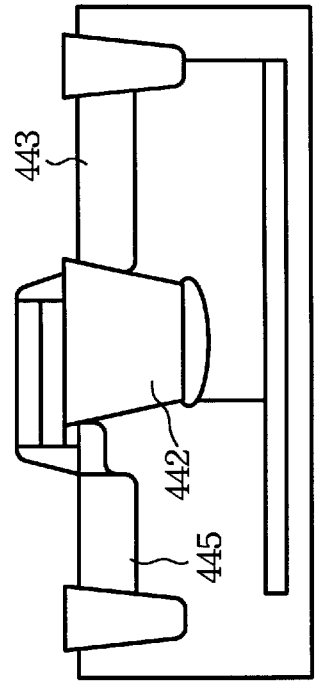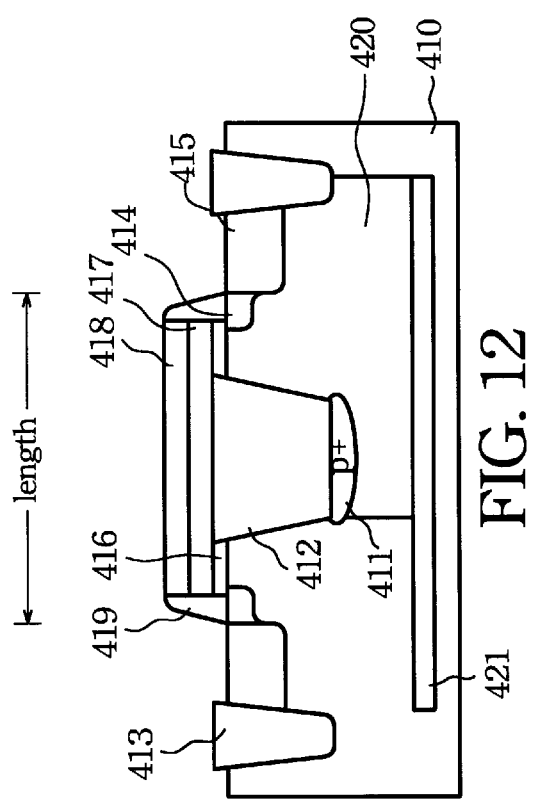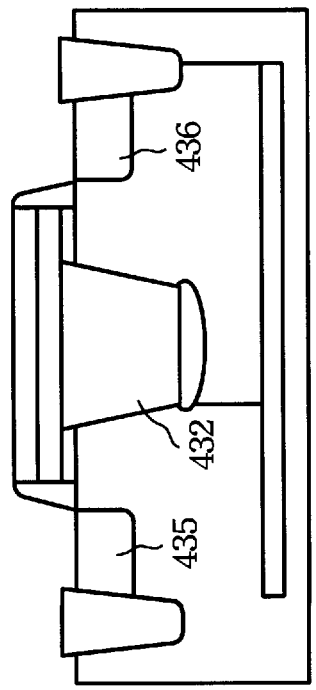

ELECTROSTATIC DISCHARGE DEVICE WITH GATE-CONTROLLED FIELD OXIDE TRANSISTOR

FIELD OF THE INVENTION

The present invention generally relates to a structure of ESD device, and particularly relates to an ESD device with deep current path.

BACKGROUND OF THE INVENTION

While the progress in the semiconductor integrated circuits reaches ULSI (ultra large scale integration) level or even higher level, the integrity of the integrated circuits rises at an amazing rate. The capacity of a single semiconductor chip increases from several thousand devices to hundreds of million devices, or even to billions of devices. Taking DRAM (dynamic random access memories) for example, the increasing integrity in manufacturing extends the capacity of a single chip to step from earlier 4 megabit to 16 megabit, and further to 256 megabit or even higher. Integrated circuit devices like transistors, capacitors, and connections must be greatly narrowed accompanying with the advancement. The increasing packing density of integrated circuits generates numerous challenges to the semiconductor manufacturing process. Every element or device needs to be formed within a smaller area without influencing the characteristics and operations of the integrated circuits.

The electrostatic discharge (ESD) zapping has became a serious problem as the feature size of the MOS transistor has been scaled down. A semiconductor device having the input/output pad connections with external circuitry and devices is subject to the problem of ESD. The ESD is easily conducted through the input/output and the power lead connections into the internal devices and causes some damage to the semiconductor devices, especially serious ones like gate oxide breakdown and damage caused by overheating.

The general IC products are required to endure the electrostatic discharge test of the human body model with two thousand volts and the machine model with two hundred volts. Therefore, for protecting the devices from ESD damage, built-in ESD protection circuits are connected between the input/output pads and the internal circuitry. The field-oxide device is one of the most used electrostatic discharged devices.

Referring to FIG. 1 and FIG. 2, the method to fabricate the field oxide device in deep submicron CMOS process is gradually changing from LOCOS (local oxidation of silicon) process in FIG. 1 to STI (shallow trench isolation) process in FIG. 2 because of the better isolation ability of the STI. However, the performance of the STI structure as ESD device is lowered due to the lower concentration in the interface of N+ 120, 124 and field implant 122 and causing the higher junction breakdown voltage of STI. Referring to FIG. 3, another ESD device with low $V_{bd}$ is the GGNMOS (gate grounded thin oxide NMOS). The ESD current path in the GGNMOS is near the surface of the substrate 136 and the heat dissipation is not easy. Moreover, the MOSFET has the LDD peak structure 130 which often focuses the ESD current discharged through the surface channel to cause a low ESD level.

Therefore, an ESD device with low junction breakdown voltage and free from heat dissipation near the surface channel is strongly requested. One new ESD structure is provided in the present invention with a deep current path to achieve these demands.

SUMMARY OF THE INVENTION

The present invention provides an ESD protective device with deep current path and low breakdown voltage.

In the present invention, the P+ field implant and STI are formed in sequence in the substrate. Then, a gate oxide layer is deposited on the substrate by LPCVD or PECVD. A conductive layer and a hard mask layer are deposited on the gate oxide layer and are patterned by lithography and anisotropic etching method to form the gate structure. Next, the substrate is processed with LDD to form the LDD region by using the gate structure as a mask. A spacer is formed on the sidewall of the gate structure and the substrate is implanted to form S/D region by using the spacer as a mask. Some alternatives can be devised as follows: (1) The length between STI region and LDD region is zero; (2) without LDD region; (3) with an N well region below the field implant region, the LDD region and S/D region; (4) with a deep N well region below the N well region.

BRIEF DESCRIPTION OF THE DRAWINGS

The objects, features and advantages of the present invention will be apparent from the following more particular description of the invention illustrated in the accompanying drawings, in which:

FIG. 12 is a cross-sectional view illustrating the ESD device with a deep N well region in accordance with the present invention.

FIG. 13 is a cross-sectional view illustrating the modified ESD device with zero distance between the STI and the LDD in accordance with the present invention of FIG. 12.

FIG. 14 is a cross-sectional view illustrating the modified ESD device without LDD in accordance with the present invention of FIG. 12.

FIG. 15 is a cross-sectional view illustrating the modified ESD device with asymmetrical structure in accordance with the present invention of FIG. 12.

DETAILED DESCRIPTION OF THE PREFERRED EMBODIMENT

Figure 1:
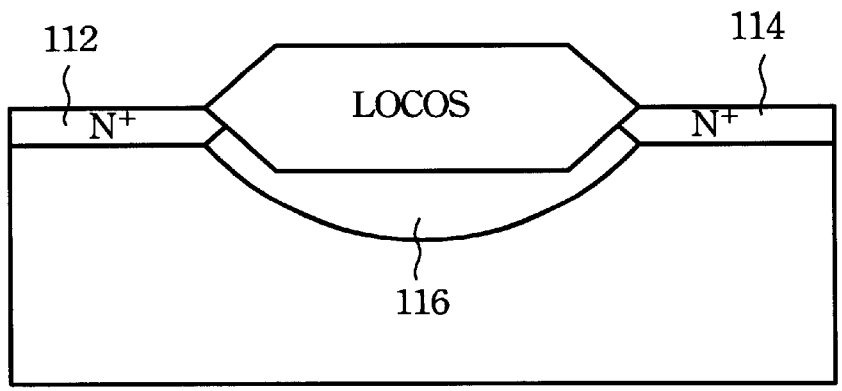
FIG. 1 is a cross-sectional view illustrating the LOCOS device in the semiconductor substrate in the prior art.

Hereinafter, the preferred embodiments of the invention will be described with reference to accompanying drawing wherein like reference numerals designate like parts, respectively.

First Embodiment

Figure 4:
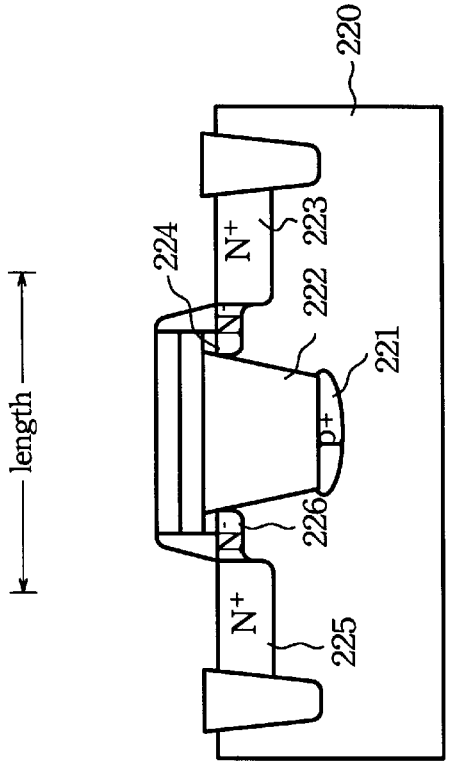
FIG. 4 is a cross-sectional view illustrating the ESD device in accordance with the present invention.

Referring to FIG. 4, a semiconductor substrate 210 with preferable single crystalline silicon in a <100> direction is provided. First, the p+ field implant 211 with a concentration about $10^{16}$ to $10^{18}$ ions/cm$^3$ and the STI 212, 213 are formed in sequence in the substrate 210. Then, a gate oxide layer 216 is deposited on the substrate 210 by LPCVD. The gate oxide layer 216 can be a dioxide layer. Next, a conductive layer 217 is deposited on the oxide layer 216 and the conductive layer 217 and can be a doped polysilicon layer or silicide layer. The doped polysilicon layer is processed by ion implant or thermal diffusion with a concentration of about $10^{19}$ to $10^{20}$ ion/cm$^3$ and the silicide layer can be tungsten silicon layer. Subsequently, a hard mask layer 218 is deposited on the conductive layer 217 and the hard mask layer 218 can be a silicon nitride layer. The depositions of the conductive layer 217 and hard mask layer 218 are performed by CVD, such as LPCVD or PECVD.

The conductive layer 217 and hard mask layer 218 are patterned by lithography and anisotropic etching method to form a gate structure. Then, the substrate 210 is processed with LDD (lightly doped drain) with a concentration range of about $10^{18}$ to $10^{20}$ ions/cm$^3$ to form the LDD region 214 by using the gate structure as a mask. Next, an oxide layer or a silicon nitride layer is deposited on the surface of the substrate 210 and is etched with anisotropic etching process to form spacer 219. Using the spacer 219 as a mask, the substrate is implanted with a concentration range about $10^{19}$ to $10^{21}$ ions/cm$^3$ to form source and drain region 215.

Figure 2:
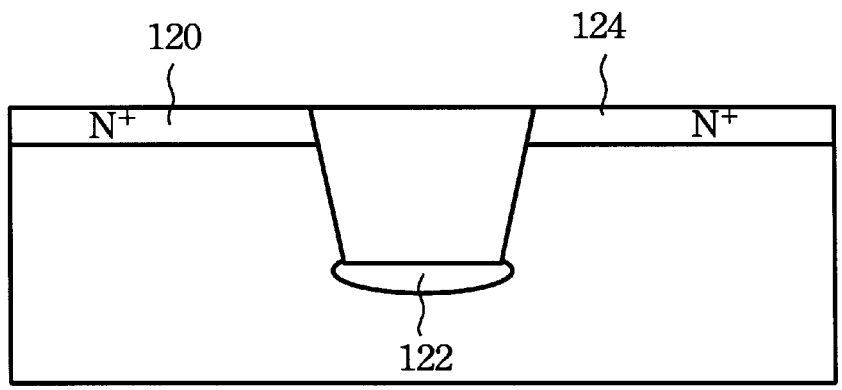
FIG. 2 is a cross-sectional view illustrating the STI device in the semiconductor substrate in the prior art.
Figure 3:
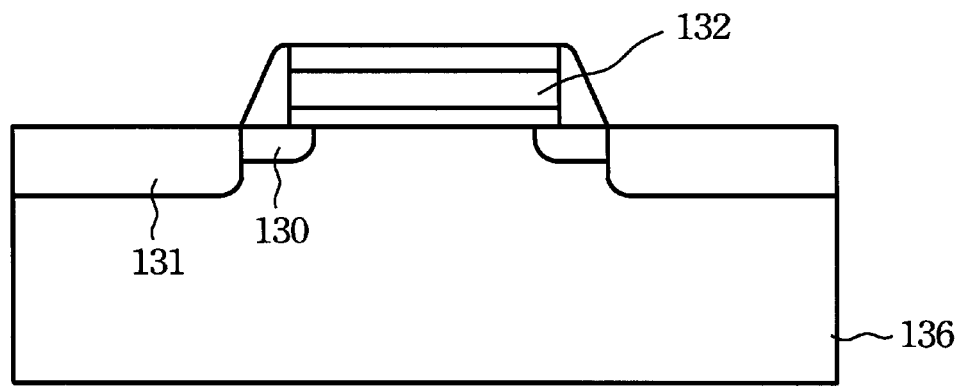
FIG. 3 is a cross-sectional view illustrating the GGNMOS device in the semiconductor substrate in the prior art.

Continuing to refer to FIG. 4, the ESD device in the present invention has a lower junction breakdown voltage than that in FIG. 1 and FIG. 2, because of the LDD region 214 and S/D region 215. More particularly, the ESD device in the present invention has a deeper current path of heat dissipation than that in FIG. 3. The other difference between GGNMOS in FIG. 3 and the present invention in FIG. 4 is that the latter one is discharged by deep current path—from S/D region 215, LDD region 214, then to substrate 210, LDD region 214 and S/D region 215 in sequence. The deep current path is performed by field implant 211 and STI 212 to limit the surface current path and to increase its ESD robustness.

Figure 5:
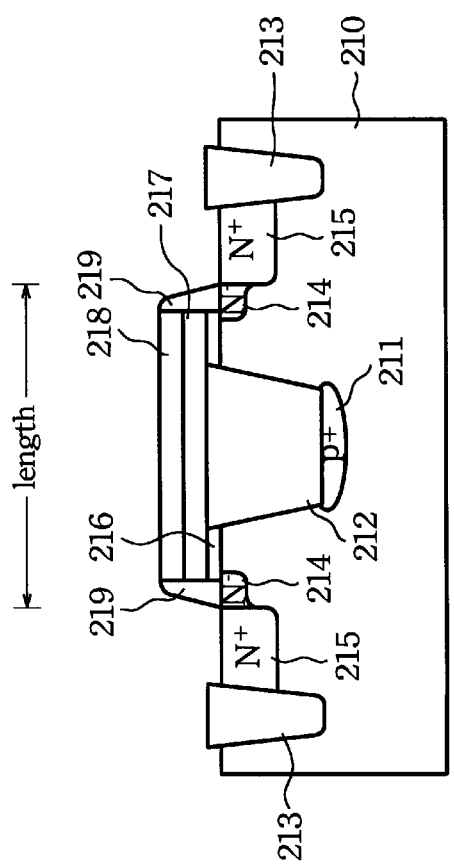
FIG. 5 is a cross-sectional view illustrating the ESD device with zero distance between the STI and the LDD in accordance with the present invention.
Figure 6:
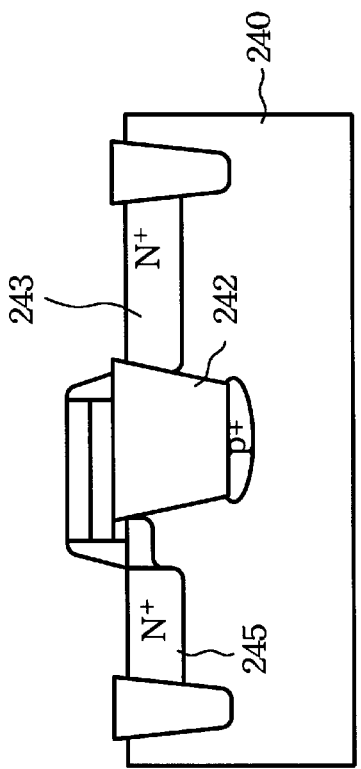
FIG. 6 is a cross-sectional view illustrating the ESD device without LDD in accordance with the present invention.
Figure 7:
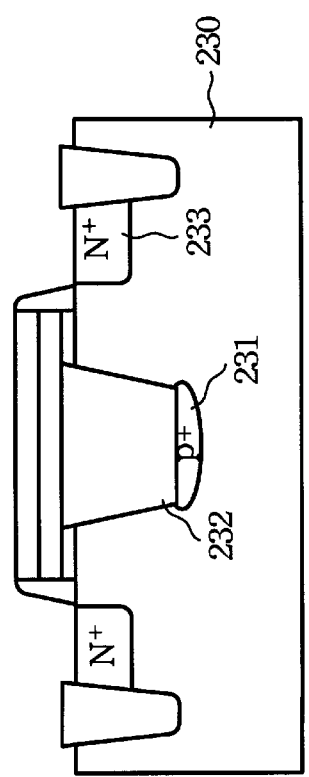
FIG. 7 is a cross-sectional view illustrating the ESD device with asymmetrical structure in accordance with the present invention.

For those skilled in the art, one can apply the fabrication process described above and some alternative ESD device can be devised as follows. Referring to FIG. 5, the only difference between FIG. 4 and FIG. 5 is that the distance between STI region 222 and LDD region 224, 226 is zero in FIG. 5. And the length of the transistor device in FIG. 5 is shorter than that in FIG. 4. Referring to FIG. 6, the only difference between FIG. 4 and FIG. 6 is that the LDD region is omitted in FIG. 6. Referring to FIG. 7, the device includes only one LDD region adjacent to the heavily doped region and STI, which has an asymmetrical structure. One skilled in the art can devise the structure in FIG. 4 depending on the specific demand.

Second Embodiment

Figure 8:
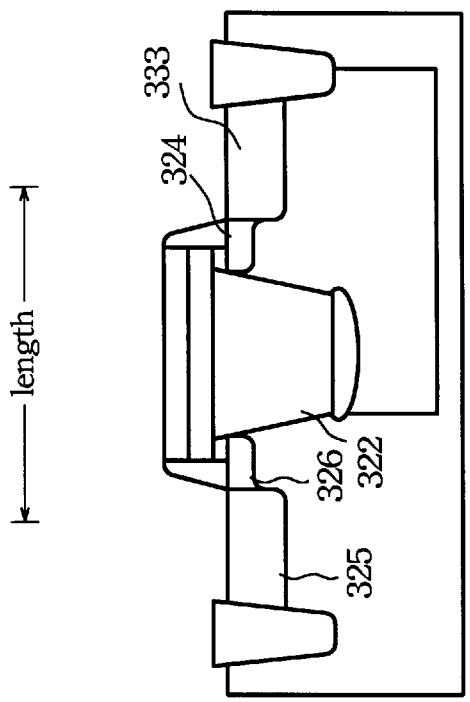
FIG. 8 is a cross-sectional view illustrating the ESD device with an N well region in accordance with the present invention.

Referring to FIG. 8, the N well 320 with the concentration about $10^{16}$ to $10^{18}$ ions/cm$^3$ is formed in the semiconductor substrate 310 with a preferable single crystalline silicon in a <100> direction. Next, the p+ field implant 311 with the concentration about $10^{16}$ to $10^{18}$ ions/cm$^3$ is performed by an ion implant method and STI region 312, 313 are fabricated with a conventional method. Then, a gate oxide layer 316 is deposited on the substrate 310 by PECVD. The gate oxide layer 316 can be a dioxide layer. Next, a conductive layer 317 and hard mask layer 318 are deposited on the oxide layer 316 in sequence. The conductive layer 317 can be a doped polysilicon layer or a silicide layer and the hard mask layer 318 can be a silicon nitride layer. The depositions of the conductive layer 317 and hard mask layer 318 are performed by CVD, such as LPCVD.

The conductive layer 317 and hard mask layer 318 are patterned by anisotropic etching method to form a gate structure. Then, the LDD region 314 with the concentration range about $10^{18}$ to $10^{20}$ ions/cm$^3$ is formed by using the gate structure as a mask. Next, an oxide layer is deposited on the surface of the substrate 310 and is etched with anisotropic etching process to form spacer 319. Using the spacer 319 as a mask, the substrate is implanted to form source and drain region 315. In FIG. 8, the N well region 320 can increase the depth of the current path in the device.

Figure 9:
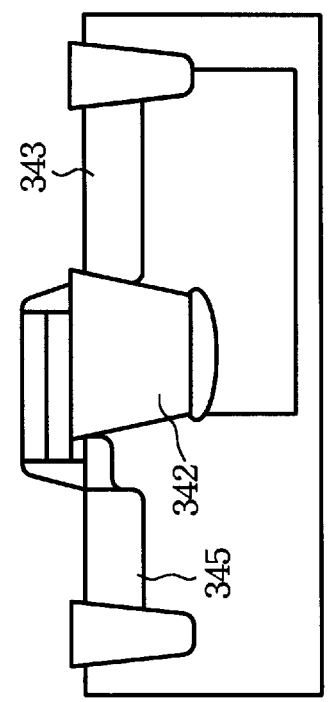
FIG. 9 is a cross-sectional view illustrating the modified ESD device with zero distance between the STI and the LDD in accordance with the present invention of FIG. 8.
Figure 10:
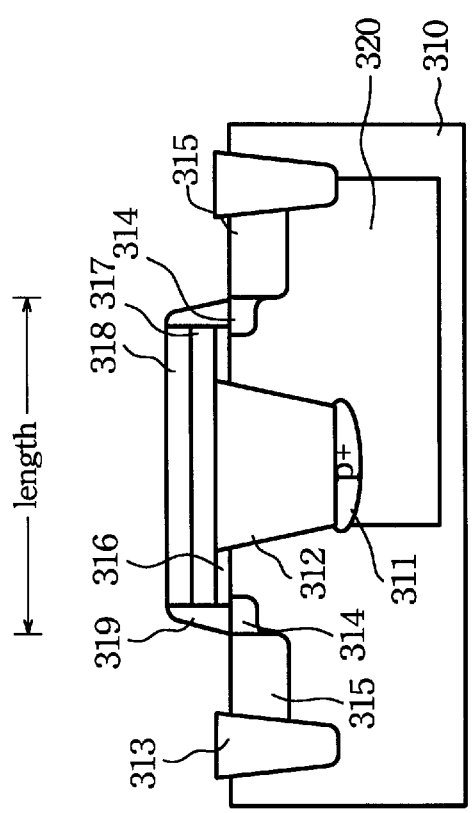
FIG. 10 is a cross-sectional view illustrating the modified ESD device without LDD in accordance with the present invention of FIG. 8.
Figure 11:
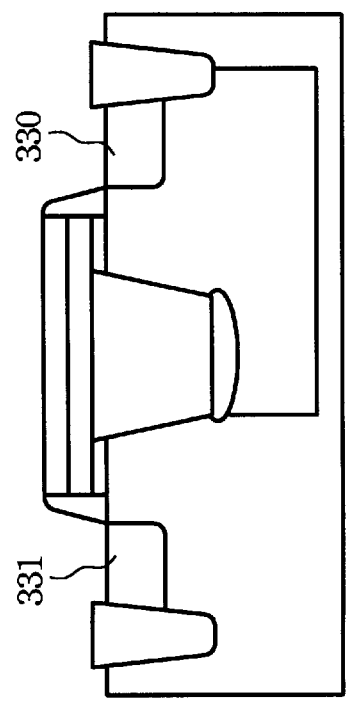
FIG. 11 is a cross-sectional view illustrating the modified ESD device with asymmetrical structure in accordance with the present invention of FIG. 8.

Referring to FIG. 9, the distance between STI region 322 and LDD region 324, 326 is zero. Referring to FIG. 10, LDD region is removed from the structure. The design without the LDD region can further reduce the junction breakdown voltage. Referring to FIG. 11, the device includes only one LDD region and the STI 342 is contact with S/D region 343 to make the device with an asymmetrical structure.

Third Embodiment

Referring to FIG. 12, the fabrication process is almost the same as described in Second Embodiment. But the deep N well 421 with the concentration about $10^{16}$ to $10^{18}$ ions/cm$^3$ is performed in the substrate 410 before the steps of forming N well 420 with the concentration about $10^{16}$ to $10^{18}$ ions/cm$^3$. The deep N well region 421 can increase the depth of current path in the device and can increase the capacity of heat dissipation.

Take a mention on the FIGS. 8–11 and FIGS. 12–15, FIG. 12, FIG. 13, FIG. 14 and FIG. 15 are the structures in FIG. 8, FIG. 9, FIG. 10 and FIG. 11 but with deep N well under the N well region, respectively. Therefore, the deep N well region in FIGS. 12–15 can more increase the ESD robustness of the proposed ESD protection devices.

From the description above, the present invention provides an ESD device with a STI structure below a transistor, as shown in the first embodiment. The ESD device in the present invention has a lower junction breakdown voltage than that of a traditional field-oxide device. More particularly, the field implant and the STI structure in the present invention can limit the surface current path to achieve the deep current path and increase the ESD robustness of the ESD protection devices. In the second embodiment, there is an N well region which increases the depth of current path in the device. In the third embodiment, there is an N well region and a deep N well region which can further increase the depth of the current depth in the device.

One can apply the fabrication process described above and some alternative ESD device can be devised depending on the specific demand. The distance between the STI region and the LDD region can be shrinked to zero to decrease the device area and decrease the current path. Therefore, the robustness of the electrostatic discharge can be increased, or the ESD device without LDD region can also be devised.

While the invention has been described in terms of three preferred embodiments, various alternatives and modifications can be devised by those skilled in the art without departing from the invention. Accordingly, the present invention is intended to embrace all such alternatives which fall within the scope of the appended claims.

The embodiments of the invention in which an exclusive property or privilege is claimed are defined as follows:

1. An electrostatic discharge (ESD) device on a substrate, said device comprising:
   - a field implant region, said field implant region being in said substrate;
   - a STI (shallow trench isolation), said STI being on said field implant region;
   - a gate oxide layer;
   - a doped region having a side, said doped region being below said gate oxide layer and being on the two sides of said STI;
   - an N well region, said N well region being below said field implant region, said STI, said gate oxide layer and below the side of said doped region;
   - a gate having a sidewall, said gate being on said gate oxide layer and said STI; and
   - a spacer, said spacer being on the sidewall of said gate.

2. The device according to claim 1, wherein said STI is adjacent to said doped region.

3. The device according to claim 1, said device further comprising a LDD (lightly doped drain) region being below said gate oxide layer and being between said STI and doped region.

4. The device according to claim 3, wherein said LDD region is adjacent to said STI.

5. The device according to claim 1, said device further comprising a deep N well region below said N well region.

6. The device according to claim 5, wherein said STI is adjacent to said doped region.

7. The device according to claim 5, said device further comprising a LDD (lightly doped drain) region being below said gate oxide layer and being between said STI and doped region.

8. The device according to claim 5, wherein said LDD region is adjacent to said STI.

* * * * *